US012640210B2

(12) United States Patent
Yun et al.

(10) Patent No.: US 12,640,210 B2
(45) Date of Patent: May 26, 2026

(54) SERIAL INTERFACE RECEIVER AND AN OFFSET CALIBRATION METHOD THEREOF

(71) Applicant: SAMSUNG ELECTRONICS CO., LTD., Suwon-si (KR)

(72) Inventors: Dam Yun, Suwon-si (KR); Dongyeon Kwag, Suwon-si (KR); Dongwoo Baek, Suwon-si (KR); Jehyung Yoon, Suwon-si (KR); Sangik Cho, Suwon-si (KR); Dae-Hoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 311 days.

(21) Appl. No.: 18/384,927

(22) Filed: Oct. 30, 2023

(65) Prior Publication Data

US 2024/0347114 A1     Oct. 17, 2024

(30) Foreign Application Priority Data

Apr. 14, 2023     (KR) ........................ 10-2023-0049193

(51) Int. Cl.
| | |
|---|---|
| *G11C 16/30* | (2006.01) |
| *H03F 3/45* | (2006.01) |
| *H03K 17/56* | (2006.01) |

(52) U.S. Cl.
CPC ......... *G11C 16/30* (2013.01); *H03F 3/45475* (2013.01); *H03K 17/56* (2013.01)

(58) Field of Classification Search
CPC .................................................... G11C 16/30
See application file for complete search history.

(56) References Cited

U.S. PATENT DOCUMENTS

| | | | |
|---|---|---|---|
| 8,319,559 B2 | 11/2012 | Kocer et al. | |
| 9,734,917 B2 | 8/2017 | Wang et al. | |
| 10,090,675 B1 * | 10/2018 | Lam ..................... | H02M 3/157 |
| 10,234,829 B2 | 3/2019 | Dickey et al. | |
| 10,587,225 B2 | 3/2020 | Klaren et al. | |
| 2007/0115019 A1 * | 5/2007 | Bonaccio ........... | G01R 31/2884 |
| | | | 324/762.01 |

(Continued)

FOREIGN PATENT DOCUMENTS

| | | |
|---|---|---|
| CN | 114129895 | 3/2022 |
| EP | 3024142 | 5/2016 |

*Primary Examiner* — Douglas King
(74) *Attorney, Agent, or Firm* — Morgan, Lewis & Bockius LLP

(57) ABSTRACT

A parallel e-fuse device including: a first e-fuse to receive an input voltage and transfer a first fuse current to an output terminal; and a second e-fuse to receive the input voltage and transfer a second fuse current to the output terminal, the first e-fuse includes: a power transistor to control the first fuse current according to a gate voltage; a clamp amplifier to provide a charging current to charge a gate of the power transistor, the charging current being obtained by monitoring a feedback voltage; a balance amplifier to provide a first sinking current to discharge the gate of the power transistor, the first sinking current being obtained by comparing a current sensing signal with a current monitoring signal, wherein the clamp amplifier generates the charging current according to a differential voltage between the feedback voltage and a reference voltage.

8 Claims, 8 Drawing Sheets

(56)          References Cited

U.S. PATENT DOCUMENTS

| | | | |
|---|---|---|---|
| 2008/0158933 A1* | 7/2008 | Allen | G11C 17/18 |
| | | | 365/96 |
| 2008/0169843 A1* | 7/2008 | Aipperspach | G11C 29/026 |
| | | | 327/51 |
| 2009/0212850 A1* | 8/2009 | Aipperspach | G11C 29/02 |
| | | | 327/525 |
| 2019/0332132 A1* | 10/2019 | Martini | G05F 1/46 |
| 2023/0065848 A1* | 3/2023 | Li | H02H 9/025 |

* cited by examiner

SERIAL INTERFACE RECEIVER AND AN OFFSET CALIBRATION METHOD THEREOF

CROSS-REFERENCE TO RELATED APPLICATION

This application claims priority under 35 U.S.C. § 119 to Korean Patent Application No. 10-2023-0049193 filed on Apr. 14, 2023, in the Korean Intellectual Property Office, the disclosure of which is incorporated by reference herein in its entirety.

TECHNICAL FIELD

Embodiments of the present disclosure described herein relate to a semiconductor device, and more particularly, to an adaptive parallel e-fuse device, a power supply device, and a current balance control method thereof.

DISCUSSION OF RELATED ART

Recently, there has been a surge in demand for storage devices used in various data services, including data centers, servers and artificial intelligence AI services. In particular, a solid state drives (SSDs) that utilize a flash memory are becoming the preferred choice for such storage devices. These storage devices may be equipped with a storage controller, a buffer, and a flash memory, and they operate by receiving power from external sources.

SSDs used in servers and data centers demand high power to ensure stable and large-capacity data services. To stably supply this power, SSDs employ parallel E-Fuses to receive the maximum amount of supplied power. This is because two or more E-Fuses connected in parallel can deliver more power than a single fuse. However, an imbalance in the current supplied to each of the parallel E-Fuses can result in just one E-fuse bearing a larger power burden than the other. Consequently, the two parallel E-Fuses may be subjected to a faster thermal shut down as compared to when they output uniform power. Therefore, a current balancing function is required.

In E-Fuses, a method is employed to balance the current by increasing the "on-resistance (Ron)" of any one E-Fuse among the E-Fuses connected in parallel. However, this current balancing method not only reduces the overall efficiency of the E-Fuse, but also increases the power consumption of individual E-Fuses. This can negatively affect system stability.

SUMMARY

Embodiments of the present disclosure provides a stable reference voltage by blocking a leakage current in a serial interface receiver as well as an offset calibration method that is not affected by a leakage current in a serial interface receiver.

According to an embodiment of the present disclosure, there is provided a parallel e-fuse device including: a first e-fuse configured to receive an input voltage and transfer a first fuse current to an output terminal; and a second e-fuse configured to receive the input voltage and transfer a second fuse current to the output terminal, wherein the first e-fuse includes: a power transistor configured to control a magnitude of the first fuse current according to a gate voltage and transmit the first fuse current to the output terminal; a clamp amplifier configured to provide a charging current to charge a gate of the power transistor, the charging current being obtained by monitoring a feedback voltage obtained by feeding back a voltage of the output terminal; a balance amplifier configured to provide a first sinking current to discharge the gate of the power transistor, the first sinking current being obtained by comparing a current sensing signal obtained by sensing the first fuse current with a current monitoring signal that corresponds to a result of monitoring the second fuse current, wherein the clamp amplifier generates the charging current according to a differential voltage between the feedback voltage and a reference voltage.

According to an embodiment of the present disclosure, there is provided a power supply device for supplying power to a storage device including: a first e-fuse device receiving an input voltage and transferring a first fuse current to an output terminal; and a second e-fuse device connected in parallel with the first e-fuse device between the input voltage and the output terminal and transferring a second fuse current to the output terminal, wherein the first e-fuse device or the second e-fuse device activates a current balancing operation of the first fuse current and the second fuse current in a soft-start mode or a clamp mode of the power supply device, and disables the current balancing operation in a steady state mode.

According to an embodiment of the present disclosure, there is provided a current balancing method for a parallel e-fuse device comprising a first e-fuse and a second e-fuse, the method including: receiving a feedback voltage obtained by feeding back an output voltage of the parallel e-fuse device and a reference voltage for determining an operation mode of the parallel e-fuse device; activating a current balancing function of the first e-fuse or the second e-fuse when a magnitude of a differential voltage between the feedback voltage and the reference voltage is less than or equal to a reference value; and deactivating the current balancing function of the first e-fuse or the second e-fuse when the magnitude of the differential voltage is greater than the reference value.

BRIEF DESCRIPTION OF THE DRAWINGS

The above and other features of the present disclosure will become apparent by describing in detail embodiments thereof with reference to the accompanying drawings.

DETAILED DESCRIPTION OF THE EMBODIMENTS

Hereinafter, embodiments of the present disclosure will be described with reference to the accompanying drawings. It is to be understood, however, that various changes and modifications may be made to the embodiments disclosed herein as contemplated by those skilled in the art.

Figure 1:
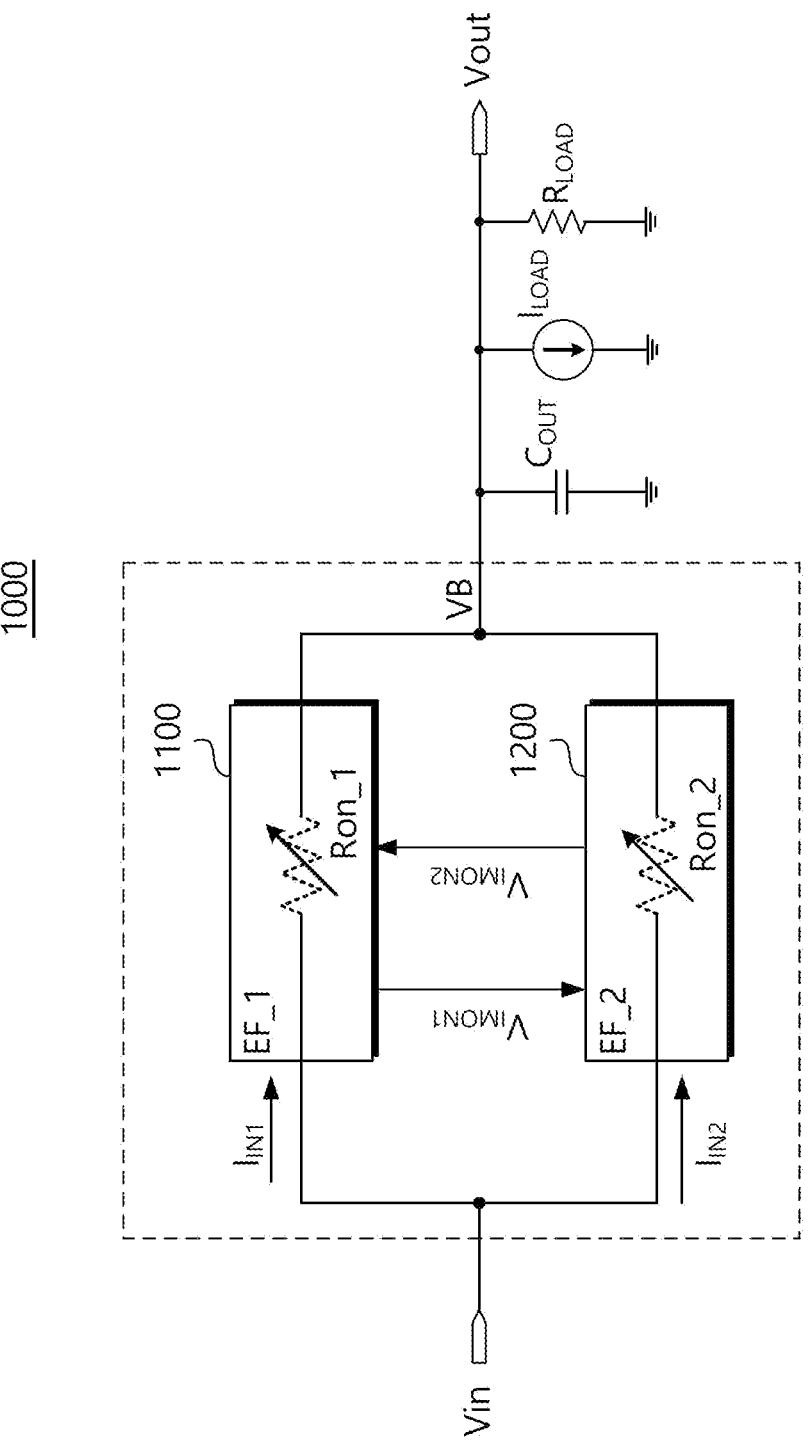
FIG. 1 is a block diagram showing the configuration of a parallel e-fuse according to an embodiment of the present disclosure.

FIG. 1 is a block diagram showing the configuration of a parallel e-fuse according to an embodiment of the present disclosure. Referring to FIG. 1, a parallel e-fuse 1000 of the present embodiment includes a first e-fuse 1100 and a second e-fuse 1200 that transfer an input voltage Vin in parallel. It will be understood that an output capacitor $C_{OUT}$, a load resistance $R_{LOAD}$, and a load current $I_{LOAD}$ are external elements of the parallel e-fuse 1000 and express the state of an output terminal when a load is connected to the parallel e-fuse 1000.

The first e-fuse 1100 and the second e-fuse 1200 each transfer the power provided through the input voltage Vin to an output voltage Vout terminal to deliver the power to the load. Here, the load may include a DC-DC converter or a power loss protection PLP integrated circuit for charging a capacitor by boosting the input voltage Vin or providing the input voltage Vin as driving power.

The first e-fuse 1100 and the second e-fuse 1200 are connected in parallel to deliver maximum power provided through the input voltage Vin to the load side. This is because, through a parallel connection, the first and second e-fuses 1100 and 1200 can supply more current than a single e-fuse can supply on its own.

The first e-fuse 1100 may transfer a first fuse current $I_{IN1}$ to an output terminal VB under the condition of the input voltage Vin. Additionally, the second e-fuse 1200 may transfer a second fuse current $I_{IN2}$ to the output terminal VB under the condition of the input voltage Vin. If a current imbalance occurs in which the first fuse current $I_{IN1}$ increases to be larger than the second fuse current $I_{IN2}$, a power load may be concentrated to the first e-fuse 1100. Accordingly, the first e-fuse 1100 may reach a thermal shut-down state earlier than the equilibrium state of the first fuse current $I_{IN1}$ and the second fuse current $I_{IN2}$. Therefore, to maintain a stable power supply, a balance between the first fuse current $I_{IN1}$ and the second fuse current $I_{IN2}$ must be maintained.

To maintain the current balance between the first fuse current $I_{IN1}$ and the second fuse current $I_{IN2}$, an on-resistance Ron of either the first e-fuse 1100 or the second e-fuse 1200 may be adjusted. For example, to reduce the first fuse current $I_{IN1}$ for current balancing, the on-resistance Ron_1 of the first e-fuse 1100 should be increased. If a current balance is implemented by adjusting the on-resistance Ron, power efficiency may decrease in a specific mode of the parallel e-fuse 1000. Consequently, power consumption of the first e-fuse 1100 and the second e-fuse 1200 may also be increased. Furthermore, when using this technique, the stability of the parallel e-fuse 1000 may also decrease, causing frequent thermal shut-down events.

The parallel e-fuse 1000 of the present embodiment can perform an adaptive current balancing operation that selectively activates or deactivates current balancing in various operating modes. For example, there may sometimes be a mismatch between the on-resistances Ron_1 and Ron_2 of the first e-fuse 1100 and the second e-fuse 1200. In this case, when the parallel e-fuse 1000 operates in a steady state mode, power loss that occurs when current balancing is applied is greater than when current balancing is not applied.

On the other hand, when the parallel e-fuse 1000 operates in a soft-start mode or performs a clamp operation, current may be biased due to the gate capacitance of a power switch or the offset of a clamp amplifier. Therefore, employing current balancing in the soft-start mode or the clamp mode of the parallel e-fuse 1000 can reduce power loss due to current bias.

Therefore, the parallel e-fuse 1000 of the present embodiment can use an adaptive current balancing function that activates current balancing only in an operation mode or a duration in which current balancing is required. For the adaptive current balancing function, the first e-fuse 1100 and the second e-fuse 1200 can detect a soft-start mode and a clamp mode. In addition, the first e-fuse 1100 and the second e-fuse 1200 activate the current balancing function only in the soft-start mode and the clamp mode. On the other hand, the first e-fuse 1100 and the second e-fuse 1200 may disable the current balancing function in a steady state mode in which each power transistor is fully turned on.

To perform the adaptive current balancing function, the first e-fuse 1100 detects a first fuse current $I_{IN1}$ flowing through an internal power transistor. As a result of the detection, the first e-fuse 1100 generates a first current monitoring signal $V_{IMON1}$. The first e-fuse 1100 provides the first current monitoring signal $V_{IMON1}$ to the second e-fuse 1200. Similarly, the second e-fuse 1200 detects the second fuse current $I_{IN2}$ flowing through the internal power transistor. As a result of the detection, the second e-fuse 1200 generates a second current monitoring signal $V_{IMON2}$. The second e-fuse 1200 provides the second current monitoring signal $V_{IMON2}$ to the first e-fuse 1100.

The first e-fuse 1100 controls the gate voltage of the power transistor according to the level of a feedback voltage $V_{FB}$ obtained by feeding back the output voltage Vout in a start period in which power is turned on. The scenario where the feedback voltage $V_{FB}$ does not differ from a reference voltage $V_{CDVDT}$ of a ramp waveform corresponds to this case. This control operation is intended to reduce surges or voltage shocks that occur when power is supplied to a system equipped with the parallel e-fuse 1000. This control mode is called a soft-start mode. In the soft-start mode, the first e-fuse 1100 activates the current balancing operation with the second e-fuse 1200. Thus, in the soft-start mode, the balance between the first fuse current $I_{IN1}$ and the second fuse current $I_{IN2}$ may be maintained.

The first e-fuse 1100 also operates in a clamp mode in which the level of the output voltage Vout is clamped to a certain level when the input voltage Vin becomes higher than a predetermined clamp reference voltage $V_{REF\_CLAMP}$. In the clamp mode, the first e-fuse 1100 activates a current balancing operation with the second e-fuse 1200. Thus, in the clamp mode, the balance between the first fuse current $I_{IN1}$ and the second fuse current $I_{IN2}$ may be maintained.

On the other hand, an operation mode in which the soft-start mode is completed and the power transistors of the first e-fuse 1100 and the second e-fuse 1200 maintain fully turned-on states will be referred to as a steady state mode. In the steady state mode, the first e-fuse 1100 and the second e-fuse 1200 each disable the current balancing operation. Thus, although a current imbalance between the first fuse current $I_{IN1}$ and the second fuse current $I_{IN2}$ may exist in the steady state mode, since more current flows to the lower resistance side, there is relatively lower power loss than in the current balancing state.

The parallel e-fuse 1000 of the present embodiment described above includes a plurality of e-fuses 1100 and 1200 in which a current balancing function is selectively activated depending on an operation mode. For example, the parallel e-fuse 1000 activates the current balancing function in a soft-start and a clamp mode. On the other hand, the parallel e-fuse 1000 disables the current balancing function in a steady state mode. Power loss occurring in the parallel e-fuse 1000 can be minimized by adaptively activating the current balancing function for each mode.

Figure 2:
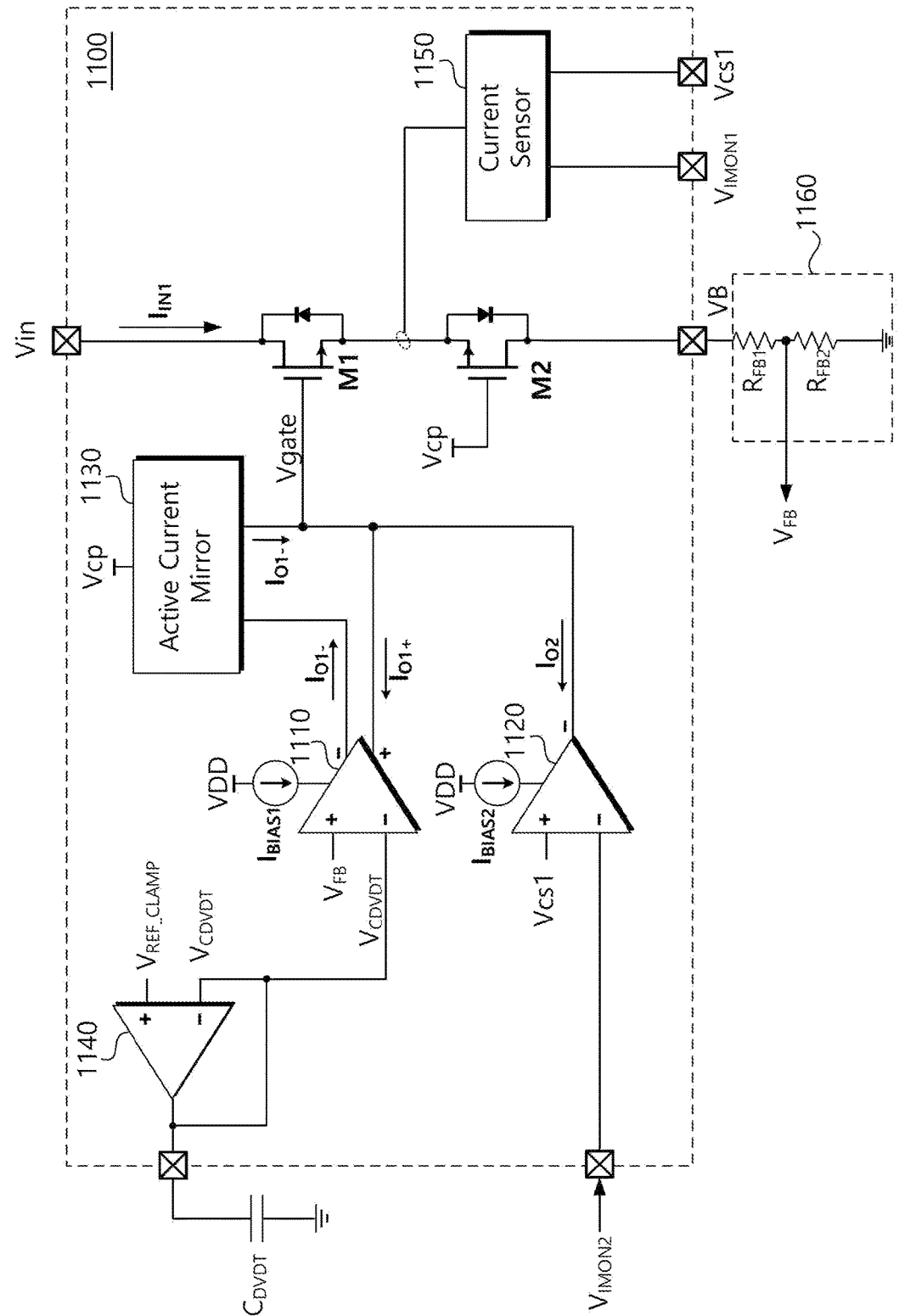
FIG. 2 is a block diagram showing a detailed configuration of a first e-fuse of FIG. 1.

FIG. 2 is a block diagram showing a detailed configuration of the first e-fuse of FIG. 1. Referring to FIG. 2, the first e-fuse 1100 includes power transistors M1 and M2, a clamp amplifier 1110, a balance amplifier 1120, an active current mirror 1130, a mode detection amplifier 1140, and a current sensor 1150. The second e-fuse 1200 in FIG. 1 has substantially the same configuration and function as the first e-fuse 1100. Therefore, the description of the components and functions of the second e-fuse 1200 will be omitted.

The power transistors M1 and M2 transmit the current provided through the input voltage Vin to the output terminal VB in response to a gate voltage Vgate and a pumping voltage Vcp, respectively. The first power transistor M1 may adjust the level of the channel current by the gate voltage Vgate that is controlled by the clamp amplifier 1110 and the balance amplifier 1120. In other words, the first power transistor M1 may adjust the size of the first fuse current $I_{IN1}$ by adjusting the size of the resistance according to the level of the gate voltage Vgate. The gate voltage Vgate of the first power transistor M1 is adjusted in the soft-start mode and the clamp mode to perform a current balancing function. On the other hand, in a normal state in which the first power transistor M1 is fully turned on, the gate voltage Vgate keeps the first power transistor M1 fully turned on. The second power transistor M2 is kept turned-on by a pumping voltage Vcp provided from a charge pump.

The clamp amplifier 1110 may increase or decrease a gate pull-up current I01− and a gate pull-down current $I_{01+}$ according to a differential voltage ($V_{FB}-V_{CDVDT}$) of the feedback voltage $V_{FB}$ and the reference voltage $V_{CDVDT}$. For example, when the feedback voltage $V_{FB}$ is lower than the reference voltage $V_{CDVDT}$, the clamp amplifier 1110 increases the pull-up current I01−. On the other hand, when the feedback voltage $V_{FB}$ is higher than the reference voltage $V_{CDVDT}$, the clamp amplifier 1110 increases the pull-down current I01+. The clamp amplifier 1110 may be connected to a voltage VDD and be provided with a bias current $I_{BIAS1}$.

The balance amplifier 1120 adjusts a sinking current $I_{O2}$ according to the difference between a first current sensing signal Vcs1 and a second current monitoring signal $V_{IMON2}$. Here, the first current sensing signal Vcs1 is a signal obtained by sensing the first fuse current $I_{IN2}$ flowing through the first e-fuse 1100 by the current sensor 1150. The second current monitoring signal $V_{IMON2}$ is a signal transmitted to the first E-fuse 1100 from the second E-fuse 1200 by sensing the second fuse current $I_{IN2}$ in the second E-fuse 1200 of the parallel E-fuse 1000. Accordingly, the balance amplifier 1120 controls the sinking current $I_{O2}$ according to the difference between the first fuse current $I_{IN1}$ and the second fuse current $I_{IN2}$. The balance amplifier 1120 may be connected to a voltage VDD and be provided with a bias current $I_{BIAS2}$.

For example, when the first current sensing signal Vcs1 is higher than the second current monitoring signal $V_{MON2}$, the first fuse current $I_{IN1}$ is higher than the second fuse current $I_{IN2}$. At this time, the balance amplifier 1120 increases the gate voltage Vgate by reducing the sinking current $I_{O2}$. Then, a current balancing operation is performed in which the first fuse current $I_{IN1}$ flowing through the first power transistor M1 decreases. On the other hand, when the first current sensing signal Vcs1 is lower than the second current monitoring signal $V_{IMON2}$, the first fuse current $I_{IN1}$ is smaller than the second fuse current $I_{IN2}$. At this time, the balance amplifier 1120 increases the sinking current $I_{O2}$ to lower the gate voltage Vgate. Then, a current balance occurs as the magnitude of the first fuse current $I_{IN1}$ flowing through the first power transistor M1 increases.

The sinking current $I_{O2}$ of the balance amplifier 1120 has the ability to control the gate voltage Vgate according to the magnitude of the pull-up current $I_{01-}$ provided by the clamp amplifier 1110. In other words, when the size of the pull-up current $I_{01-}$ is significantly larger than the sinking current $I_{O2}$, control of the gate voltage Vgate through the sinking current $I_{O2}$ of the balanced amplifier 1120 is impossible. In other words, in the steady state mode ($V_F-V_{CDVDT}<0$) where the feedback voltage $V_{FB}$ is much higher than the reference voltage $V_{CDVDT}$, the current balancing function of the balance amplifier 1120 is disabled. On the other hand, when the magnitude of the pull-up current $I_{01-}$ is smaller than the sinking current $I_{O2}$, the gate voltage Vgate can be controlled through the sinking current $I_{O2}$ of the balance amplifier 1120. In other words, when the feedback voltage $V_{FB}$ is equal to or has a small difference from the reference voltage $V_{CDVDT}$ ($V_{FB}-V_{CDVDT}=0$), the current balancing function of the balance amplifier 1120 is activated. In other words, the current balancing function of the balance amplifier 1120 is enabled in the soft-start mode or clamp mode of the parallel e-fuse 1000.

The active current mirror 1130 mirrors the pull-up current $I_{01-}$ provided from the clamp amplifier 1110 and transfers the pull-up current $I_{01-}$ to the gate node of the first power transistor M1. In other words, the active current mirror 1130 may activate or deactivate the current balancing function of the balance amplifier 1120 based on the pull-up current $I_{01-}$ provided according to the operation mode.

When the pull-up current $I_{01-}$ is increased by the clamp amplifier 1110, the gate voltage Vgate of the first power transistor M1 may increase. The size of the pull-up current $I_{01-}$ is determined by the size of the differential voltage $V_{FB}-V_{CDVDT}$ between the feedback voltage $V_{FB}$ and the reference voltage $V_{CDVDT}$. In other words, in the soft-start mode or clamp mode in which the differential voltage $V_{FB}-V_{CDVDT}$ is relatively small, the pull-up current $I_{01-}$ is relatively smaller than the sinking current $I_{O2}$. Therefore, control of the gate voltage Vgate by the balance amplifier 1120 is possible. On the other hand, in the steady-state mode in which the magnitude of the differential voltage $V_{FB}-V_{CDVDT}$ between the feedback voltage $V_{FB}$ and the reference voltage $V_{CDVDT}$ is large, the magnitude of the pull-up current $I_{01-}$ is relatively larger than the sinking current $I_{O2}$. Accordingly, control of the gate voltage Vgate by the balance amplifier 1120 is impossible, and thus, the current balance function is deactivated.

The mode detection amplifier 1140 generates a reference voltage $V_{CDVDT}$. The mode detection amplifier 1140 generates the reference voltage $V_{CDVDT}$ utilizing the charging function of a capacitor $C_{DVTD}$ in the soft-start mode. In other words, the negative feedback voltage of the reference voltage $V_{CDVDT}$ connected to the negative input terminal (−) of the mode detection amplifier 1140 is generated in the form of a reference voltage by the capacitor $C_{DVTD}$. When the reference voltage $V_{CDVDT}$ rises sufficiently, the mode detection amplifier 1140 provides the reference voltage $V_{CDVDT}$ at the level of the clamp reference voltage $V_{REF\_CLAMP}$.

The current sensor 1150 monitors the magnitude of the first fuse current $I_{IN1}$ flowing through the first power transistor M1. The current sensor 1150 generates a first current sensing signal Vcs1 and a first current monitoring signal $V_{IMON1}$ based on a result of monitoring the first fuse current $I_{IN1}$. The first current sensing signal Vcs1 is provided to the balance amplifier 1120 and compared with the second current monitoring signal $V_{IMON2}$. Additionally, the first current monitoring signal $V_{IMON1}$ is provided to a balance amplifier of the second e-fuse 1200 connected in parallel with the first e-fuse 1100.

A feedback circuit 1160 is a component for feeding back the output voltage (VB or Vout) of the first e-fuse 1100 to the clamp amplifier 1110. For example, the feedback circuit 1160 may be provided in the form of a predetermined voltage dividing circuit. The feedback circuit 1160 may include resistors $R_{FB1}$ and $R_{FB2}$ connected in series.

In the above, the configuration and function of the first e-fuse 1100 according to an embodiment of the present disclosure have been briefly described. The first e-fuse 1100 activates the current balancing function of the balance amplifier 1120 using the clamp amplifier 1110 in the soft-start mode and the clamp mode. On the other hand, the first e-fuse 1100 may deactivate the current balancing function of the balance amplifier 1120 by using the clamp amplifier 1110 in the steady state mode. The function of activating/deactivating the current balancing according to the operation mode of the first e-fuse 1100 is equally applied to the second e-fuse 1200.

Figure 3:
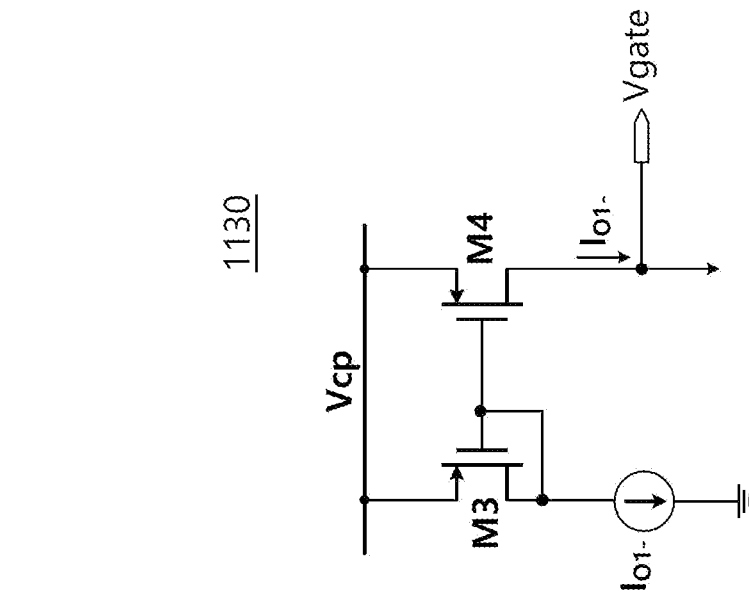
FIG. 3 is a circuit diagram showing the structure of an active current mirror of FIG. 2.

FIG. 3 is a circuit diagram showing the structure of the active current mirror of FIG. 2. Referring to FIG. 3, the active current mirror 1130 mirrors the pull-up current $I_{01\_}$ and supplies the pull-up current $I_{01\_}$ to the gate node of the first power transistor M1. The active current mirror 1130 may mirror the pull-up current $I_{01\_}$ by using the pumping voltage Vcp as a power supply voltage. The active current mirror 1130 may include a pair of transistors M3 and M4. The pull-up current $I_{01\_}$ may be output via the transistor M4 to the gate of the first power transistor M1.

When the pull-up current $I_{01\_}$ is increased by the clamp amplifier 1110 (see FIG. 2), the gate voltage Vgate of the first power transistor M1 increases. The size of the pull-up current $I_{01\_}$ is determined by the size of the differential voltage $V_{FB}$–$V_{CDVDT}$ between the feedback voltage $V_{FB}$ and the reference voltage $V_{CDVDT}$. In the soft-start mode or the clamp mode where the differential voltage $V_{FB}$–$V_{CDVDT}$ is relatively small, the pull-up current $I_{01\_}$ is relatively smaller than the sinking current $I_{O2}$. Therefore, control of the gate voltage Vgate by the balance amplifier 1120 is possible.

On the other hand, in the steady-state mode where the differential voltage $V_{FB}$–$V_{CDVDT}$ is large, the magnitude of the pull-up current $I_{01\_}$ becomes much greater than the sinking current $I_{O2}$. In this case, the gate voltage Vgate rises because the current flowing into the gate node of the first power transistor M1 is greater than the current flowing out of the gate node of the first power transistor M1. In other words, in the steady state mode, the gate voltage Vgate may rise to almost the level of the pumping voltage Vcp. Accordingly, the first power transistor M1 will remain fully turned on. As a result, the current balancing function by balance amplifier 1120 is cut off in steady state mode.

Figure 4:
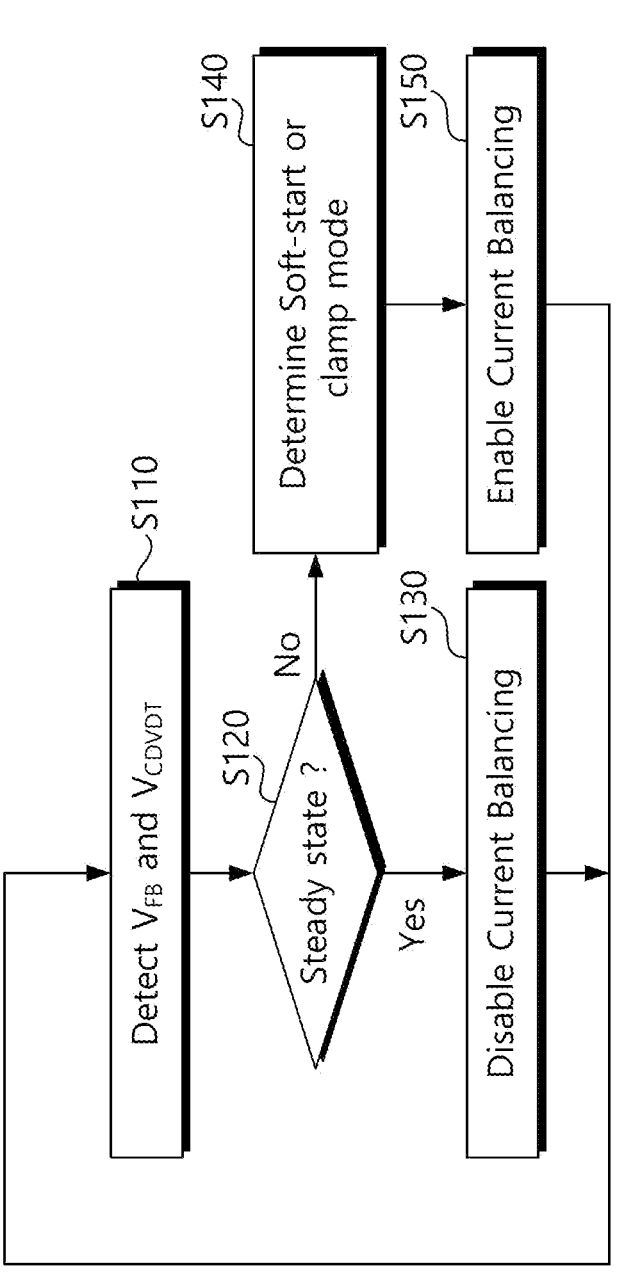
FIG. 4 is a flowchart illustrating a current balancing operation according to a mode of a first e-fuse according to an embodiment of the present disclosure.

FIG. 4 is a flowchart illustrating a current balancing operation according to a mode of a first e-fuse according to an embodiment of the present disclosure. Referring to FIG. 4, the first e-fuse 1100 activates or deactivates the current balancing function of the balance amplifier 1120 according to the differential voltage $V_{FB}$–$V_{CDVDT}$.

In step S110, the feedback voltage $V_{FB}$ and the reference voltage $V_{CDVDT}$ are detected by the clamp amplifier 1110. Reference voltage $V_{CDVDT}$ is provided by mode detection amplifier 1140.

In step S120, the clamp amplifier 1110 and the active current mirror 1130 determine the steady state mode when the differential voltage $V_{FB}$–$V_{CDVDT}$ is greater than the reference value TH ('Yes' direction). Then, the procedure proceeds to step S130. On the other hand, when the differential voltage $V_{FB}$–$V_{CDVDT}$ of the clamp amplifier 1110 and the active current mirror 1130 is smaller than the reference value TH or close to 0 ('No' direction), the procedure proceeds to step S140.

In step S130, the clamp amplifier 1110 and the active current mirror 1130 block the current balancing function by the balance amplifier 1120 by increasing the pull-up current $I_{01\_}$. Accordingly, the current balancing function of the first e-fuse 1100 is deactivated in the steady state mode.

In step S140, the clamp amplifier 1110 and the active current mirror 1130 determine the soft-start mode or the clamp mode when the differential voltage ($V_{FB}$–$V_{CDVDT}$) is less than the reference value TH or close to 0. And the procedure moves to step S150.

In step S150, the clamp amplifier 1110 and the active current mirror 1130 reduce the pull-up current $I_{01\_}$ to ensure the current balancing function of the balance amplifier 1120. Thus, the current balancing function of the first e-fuse 1100 is activated.

In the above, the adaptive current balancing method in which the current balancing function is activated or deactivated in the first e-fuse 1100 depending on the mode has been briefly described.

Figure 5:
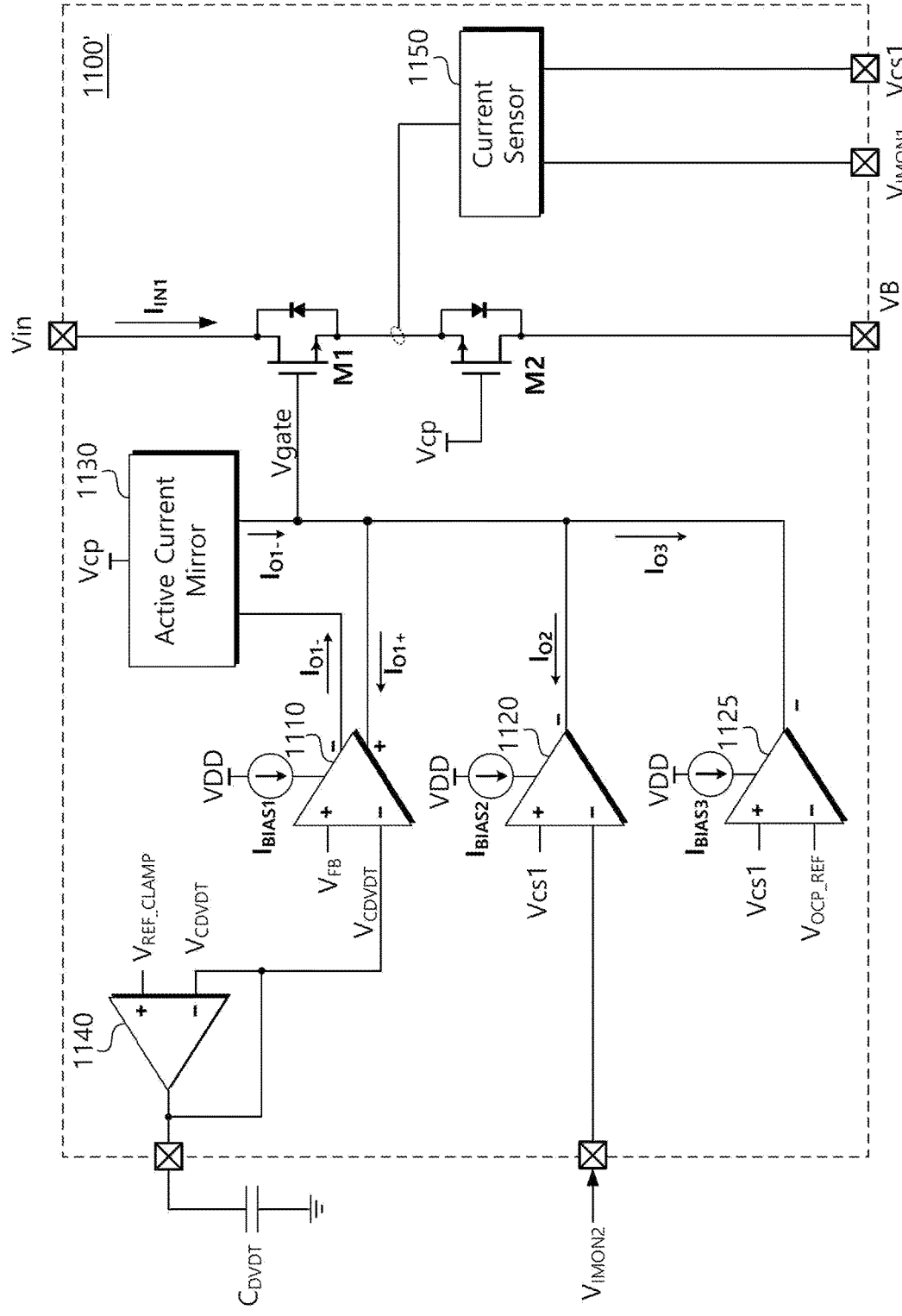
FIG. 5 is a block diagram showing the configuration of a first e-fuse according to another embodiment of the present disclosure.

FIG. 5 is a block diagram showing the configuration of a first e-fuse according to another embodiment of the present disclosure. Referring to FIG. 5, a first e-fuse 1100' according to another embodiment further includes an overcurrent protection amplifier 1125 compared to the first e-fuse 1100 of FIG. 2.

The first e-fuse 1100' according to another embodiment includes power transistors M1 and M2, a clamp amplifier 1110, a balance amplifier 1120, an active current mirror 1130, a mode detection amplifier 1140, and a current sensor 1150. Since these circuits are substantially the same as those of FIG. 2, a description of their functions will be omitted.

The overcurrent protection amplifier 1125 performs a gate voltage Vgate control operation to block an overcurrent state in which the magnitude of the first fuse current $I_{IN1}$ delivered by the first e-fuse 1100' rapidly increases. The overcurrent protection amplifier 1125 may vary a discharge current $I_{O3}$ according to the differential voltage between the first current sensing signal Vcs1 sensing the first fuse current $I_{IN1}$ and an overcurrent reference voltage $V_{OCP\_REF}$. If the magnitude of the differential voltage Vcs1–$V_{OCP\_REF}$ is smaller than 0, the overcurrent protection amplifier 1125 may generate a discharge current $I_{O3}$ to drop the gate voltage Vgate. Then, the magnitude of the first fuse current $I_{IN1}$ decreases. The overcurrent protection amplifier 1125 may be connected to a voltage VDD and be provided with a bias current $I_{BIAS3}$.

In an overcurrent blocking mode in which the overcurrent protection amplifier 1125 is activated, the balance amplifier 1120 may be activated or deactivated. In other words, power loss due to activation of the current balance function of the first e-fuse 1100' in the overcurrent cut-off mode is not significantly different from when the current balance function is deactivated. Accordingly, activation/deactivation of the balance amplifier 1120 in the overcurrent cutoff mode can be arbitrarily selected.

Figure 6:
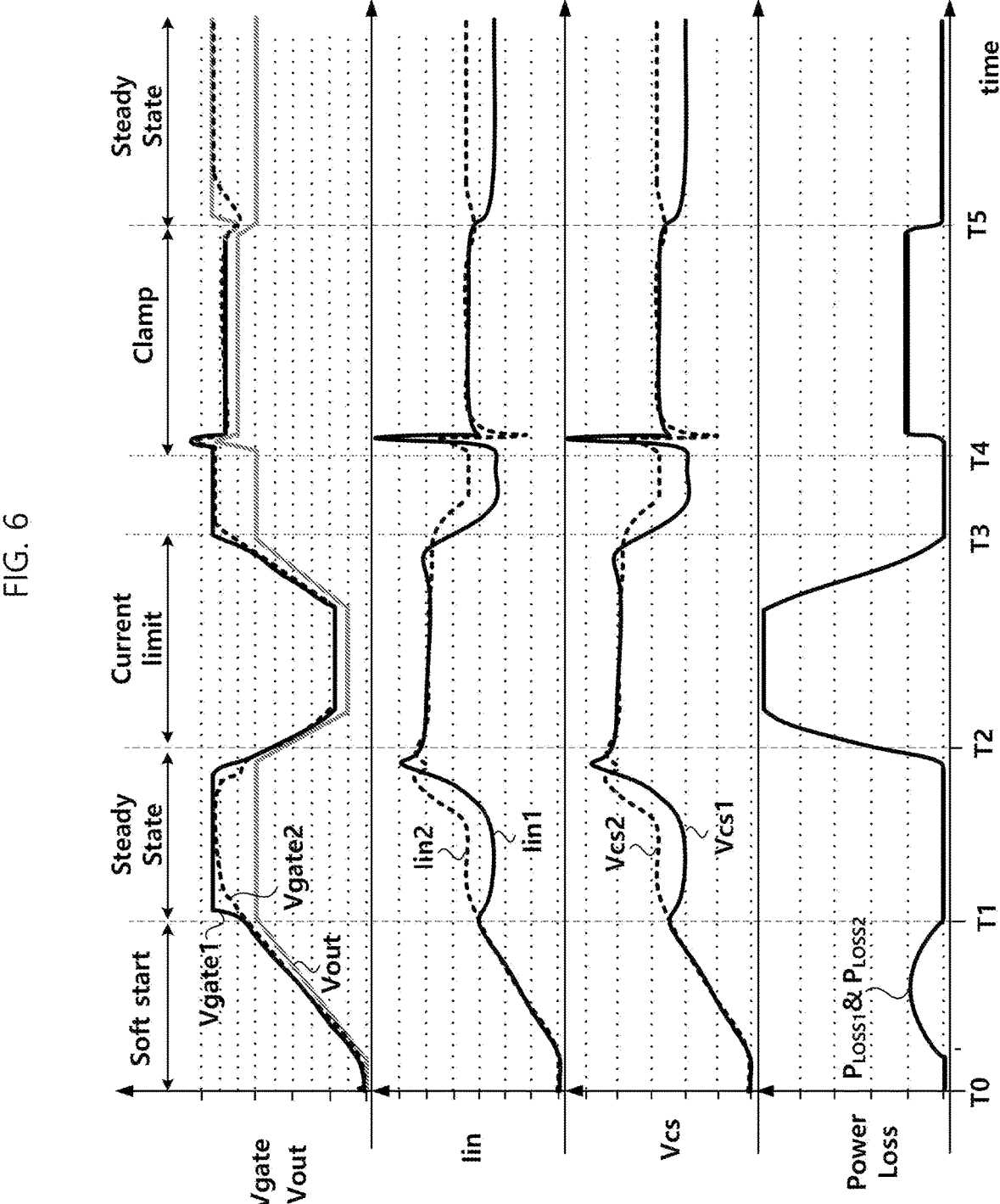
FIG. 6 is a graph showing an effect of an embodiment of the present disclosure.

FIG. 6 is a graph showing an effect of an embodiment the present disclosure. Referring to FIG. 6, in a parallel e-fuse composed of a first e-fuse 1100 and a second e-fuse 1200, gate voltages Vgate1 and Vgate2, fuse currents $I_{IN1}$ and $I_{IN2}$, current sensing signals Vcs1 and Vcs2 and the power loss are compared and shown, respectively.

The gate voltages of the power transistors adaptively controlled for each operation mode in the first e-fuse 1100 and the second e-fuse 1200 are represented by the first gate voltage Vgate1 and the second gate voltage Vgate2.

In the soft-start mode period T0 to T1, each of the first gate voltage Vgate1 and the second gate voltage Vgate2 gradually increase in the form of a ramp function. In the soft-start mode period T0 to T1, the current balancing function of the first e-fuse 1100 and the second e-fuse 1200 is activated. Accordingly, in the soft-start mode period T0 to T1, the fuse currents $I_{IN1}$ and $I_{IN2}$ show slopes of almost the same shape without being biased to either side. Since the current sensing signals Vcs1 and Vcs2 are signals obtained by substantially sensing the fuse currents $I_{IN1}$ and $I_{IN2}$, they will be observed as the same waveform as the fuse currents $I_{IN1}$ and $I_{IN2}$. In this section, power losses $P_{LOSS1}$ and $P_{LOSS2}$ of the first e-fuse 1100 and the second e-fuse 1200 are substantially the same.

In the steady state mode period T1 to T2, the current balancing function of the first e-fuse 1100 and the second e-fuse 1200 will be deactivated. Accordingly, the first gate voltage Vgate1 and the second gate voltage Vgate2 rise to a level for setting the power transistor (e.g., M1 and M2) to a fully turned-on state. In addition, in the steady state mode period T1 to T2, since the current balance function is cut off, the fuse currents $I_{IN1}$ and $I_{IN2}$ may become unbalanced. In other words, an unbalanced state may occur in which the second fuse current $I_{IN2}$ is somewhat greater than the first fuse current $I_{IN1}$. The current sensing signals Vcs1 and Vcs2 also show an unbalanced state like the fuse currents $I_{IN1}$ and $I_{IN2}$. However, power loss is relatively reduced due to the inactivation of the current balancing function in the steady state mode period T1 to T2.

In the overcurrent protection mode period T2 to T3, the current balancing function of the first e-fuse 1100 and the second e-fuse 1200 may be activated or deactivated. In the illustrated graph, the current balance function shows an activated state by way of example. Accordingly, the first gate voltage Vgate1 and the second gate voltage Vgate2 are drastically lowered to block an overcurrent. As the first gate voltage Vgate1 and the second gate voltage Vgate2 drop, the fuse currents $I_{IN1}$ and $I_{IN2}$ gradually decrease. In addition, the fuse currents $I_{IN1}$ and $I_{IN2}$ are balanced due to the activation of the current balancing function. The current sensing signals Vcs1 and Vcs2 also show a balanced state like the fuse currents $I_{IN1}$ and $I_{IN2}$. However, power loss occurs due to a relatively high current in the overcurrent protection mode section T2 to T3.

As the peak of the output voltage Vout occurs, the clamp mode period T4 to T5 is executed. In the clamp mode period T4 to T5, the current balancing function of the first e-fuse 1100 and the second e-fuse 1200 is activated. At this time, the first gate voltage Vgate1 and the second gate voltage Vgate2 maintain the same level. In the clamp mode period T4 to T5, the fuse currents $I_{IN1}$ and $I_{IN2}$ are maintained in almost the same form without being biased to either side. Since the current sensing signals Vcs1 and Vcs2 are signals obtained by substantially sensing the fuse currents $I_{IN1}$ and $I_{IN2}$, they observed the same waveform as the fuse currents $I_{IN1}$ and $I_{IN2}$.

In the above, the gate voltage, fuse current, power loss, and the like have been briefly described when current balance is adaptively activated/deactivated in the parallel e-fuse 1000 of the present embodiment.

Figure 7:
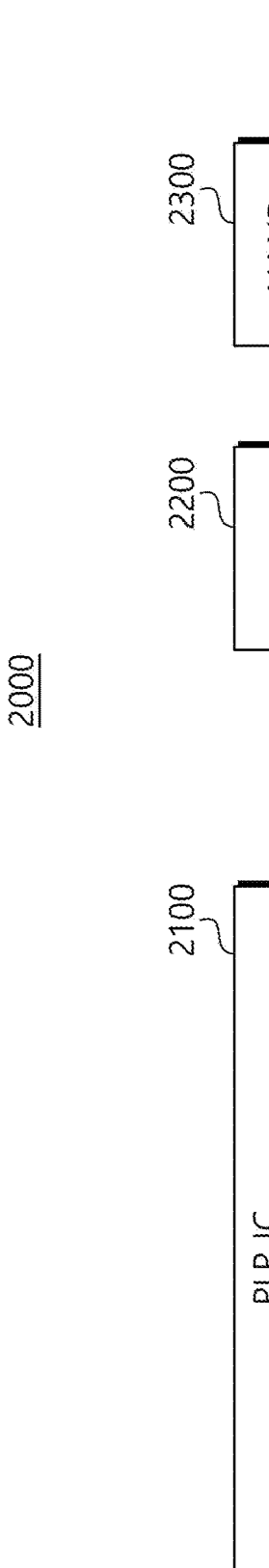
FIG. 7 is a block diagram illustrating a storage device supplying power using a parallel e-fuse according to an embodiment of the present disclosure.
Figure 7:
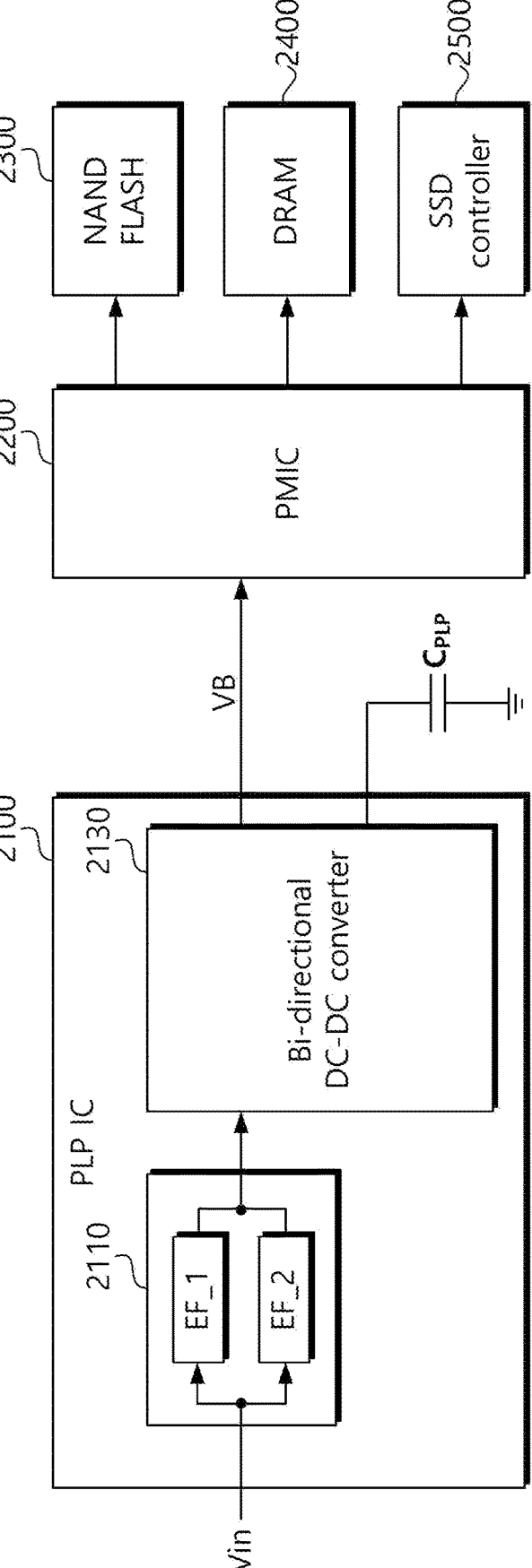

FIG. 7 is a block diagram illustrating a storage device supplying power using a parallel e-fuse according to an embodiment of the present disclosure. Referring to FIG. 7, the storage device 2000 of the present invention includes a PLP integrated circuit 2100, a power management integrated circuit PMIC 2200, a NAND flash memory device 2300, a DRAM 2400, and an SSD controller 2500. The storage device 2000 may be, for example, a solid state drive SSD.

The PLP integrated circuit 2100 may include a parallel e-fuse 2110 of present application and a bidirectional DC-DC converter 2130. The parallel e-fuse 2110 includes a plurality of e-fuses EF_1 and EF_2 whose current balancing function is adaptively activated according to the operation mode of the storage device 2000. In other words, the parallel e-fuse 2110 activates the current balancing function in a soft-start mode and a clamp mode. On the other hand, the parallel e-fuse 2110 disables the current balancing function in a steady state mode. Power loss occurring in the parallel e-fuse 2110 can be minimized by adaptively activating the current balancing function for each mode.

The bidirectional DC-DC converter 2130 may boost the voltage Vin input from the outside and provide it as the power supply voltage VB of the PMIC 2200 or to charge the capacitor $C_{PLP}$ to be used as an auxiliary power supply. For example, the input voltage Vin may be a DC voltage of 12V, and the power supply voltage VB may be a DC voltage of 30V. In other words, during normal operation, the bidirectional DC-DC converter 2130 operates in a boost mode in which the input voltage Vin is boosted and provided as the power supply voltage VB.

On the other hand, when sudden a power off or a power failure occurs, the bidirectional DC-DC converter 2130 operates in a buck mode. In other words, the bidirectional DC-DC converter 2130 drops the voltage of the charged capacitor $C_{PLP}$ and uses it as backup power for the storage device 2000. For example, the bidirectional DC-DC converter 2130 may process the voltage of the capacitor $C_{PLP}$ in a buck mode and supply it as the power supply voltage VB of the PMIC 2200. Then, the storage device 2000 may back up data stored in the DRAM 2400 or the NAND flash memory device 2300 using the backup power provided from the capacitor $C_{PLP}$.

The PMIC 2200 may receive power from the PLP integrated circuit 2100. For example, the PMIC 2200 may convert a voltage provided from the PLP integrated circuit 2100 into a stable voltage. The PMIC 2200 may provide a stable voltage to components of the SSD. For example, the PMIC 2200 may supply a stabilized voltage to the NAND flash memory device 2300 used as a storage medium, the DRAM 2400 used as a buffer, and the SSD controller 2500.

As an example, each of the PLP integrated circuit 2100 or the PMIC 2200 may be implemented as an integrated circuit chip. Each of the PLP integrated circuit 2100 or the PMIC 2200 may be mounted using various types of semiconductor packages. As an example, each of the PLP integrated circuit 2100 or the PMIC 2200 may include a package on package (PoP), ball grid arrays (BGAs), chip scale packages (CSPs), a plastic leaded chip carrier (PLCC), a plastic dual in-line package (PDLP), a Die in Waffle Pack, a Die in Wafer Form, a COB (Chip On Board), a CERDIP (Ceramic Dual In-line Package), a MQFP (Metric Quad Flat Pack), a TQFP (Thin Quad Flat Pack), a SOIC (Small Outline Integrated Circuit), a Shrink Small Outline Package (SSOP), a Thin Small Outline Package (TSOP), a System In Package (SIP), a Multi Chip Package (MCP), a Wafer-level Fabricated Package (WFP), or a Wafer-Level Processed Stack Package (WSP).

The parallel e-fuse 2110 used as a power supply circuit of the storage device 2000 activates the current balancing function of each of the e-fuses EF_1 and EF_2 in the soft-start mode and the clamp mode. On the other hand, the current balancing function may be disabled while the e-fuses EF_1 and EF_2 operate in the steady state mode. This way, it is possible to reduce power loss caused by the current balancing operation in the steady state mode.

Figure 8:
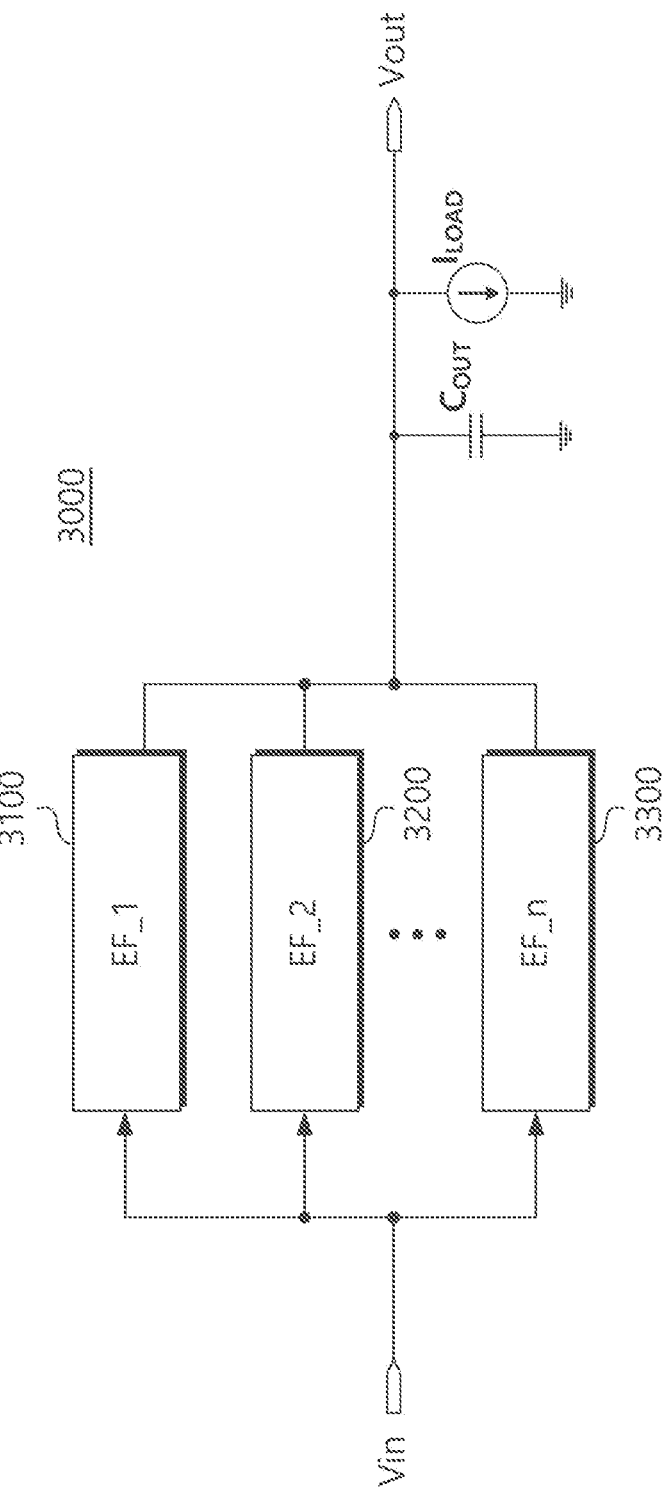
FIG. 8 is a block diagram showing an example of a parallel e-fuse according to another embodiment of the present disclosure.

FIG. 8 is a block diagram showing an example of a parallel e-fuse according to another embodiment of the present disclosure. Referring to FIG. 8, in the parallel e-fuse 3000, three or more e-fuses 3100, 3200, . . . , 3300 transfer power provided through an input voltage Vin terminal to an output voltage Vout terminal.

The first e-fuse 3100 to the nth e-fuse 3300 may be connected in parallel to transfer as much of the power provided through the input voltage Vin to the load side. Through this configuration of parallel connected e-fuses, it is possible to supply a maximum current that is more than the amount of current that can be supplied to the load side with only a single e-fuse. The configuration or function of each of the first e-fuse 3100 to the n-th e-fuse 3300 may be substantially the same as that of the e-fuse 1100 or 1100' described in FIG. 2 or FIG. 5. Additionally, each of the first e-fuse 3100 to the n-th e-fuse 3300 may activate or deactivate the current balancing function adaptively according to the operation mode. For example, in the soft-start mode or the clamp mode, each of the first e-fuse 3100 to the nth e-fuse 3300 may activate a current balancing function. Additionally, in the steady state mode, each of the first e-fuse 3100 to the nth e-fuse 3300 may deactivate the current balancing function. Power loss occurring in the parallel e-fuse 3000 can be minimized through this adaptive current balancing function.

What is claimed is:

1. A parallel e-fuse device comprising:
   a first e-fuse configured to receive an input voltage and transfer a first fuse current to an output terminal, and
   a second e-fuse configured to receive the input voltage and transfer a second fuse current to the output terminal,
   wherein the first e-fuse comprises:

a power transistor configured to control a magnitude of the first fuse current according to a gate voltage and transmit the first fuse current to the output terminal;
   a clamp amplifier configured to provide a charging current to charge a gate of the power transistor, the charging current being obtained by monitoring a feedback voltage obtained by feeding back a voltage of the output terminal;
   a balance amplifier configured to provide a first sinking current to discharge the gate of the power transistor, the first sinking current being obtained by comparing a current sensing signal obtained by sensing the first fuse current with a current monitoring signal that corresponds to a result of monitoring the second fuse current,
   wherein the clamp amplifier generates the charging current according to a differential voltage between the feedback voltage and a reference voltage.

2. The device of claim 1, wherein the clamp amplifier generates the charging current smaller than the first sinking current when the differential voltage is '0V' or less.

3. The device of claim 1, wherein when a difference between the feedback voltage and the reference voltage is equal to or less than a reference value, the parallel e-fuse device operates in a soft-start mode or a clamping mode.

4. The device of claim 1, wherein the clamp amplifier generates the charging current greater than the first sinking current when the differential voltage is greater than a reference value.

5. The device of claim 1, wherein the first e-fuse includes an active current mirror for mirroring the charging current to the gate of the power transistor using a charge pump voltage.

6. The device of claim 1, wherein the first e-fuse includes a mode detection amplifier configured to generate the reference voltage using a clamp reference voltage and a ramp voltage.

7. The device of claim 1, wherein the first e-fuse includes a current sensor configured to sense the first fuse current and generate the current sensing signal.

8. The device of claim 7, wherein the first e-fuse includes an overcurrent protection amplifier configured to generate a second sinking current to discharge the gate of the power transistor, the second sinking current being obtained by comparing the current sensing signal with an overcurrent reference level.

* * * * *